United States Patent

Kang

(10) Patent No.: US 8,138,565 B2
(45) Date of Patent: Mar. 20, 2012

(54) LATERAL DOUBLE DIFFUSED METAL OXIDE SEMICONDUCTOR DEVICE AND METHOD OF MAKING THE SAME

(75) Inventor: Chan Hee Kang, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 281 days.

(21) Appl. No.: 12/635,008

(22) Filed: Dec. 10, 2009

(65) Prior Publication Data

US 2010/0140704 A1    Jun. 10, 2010

(30) Foreign Application Priority Data

Dec. 10, 2008 (KR) .................. 10-2008-0125500

(51) Int. Cl.
*H01L 29/78* (2006.01)
*H01L 21/336* (2006.01)

(52) U.S. Cl. ...................................... 257/434

(58) Field of Classification Search .......... 257/296–304, 257/E29.027, 335–345, 565, 401–493, E29.066, 257/E29.256, 360, 361, 362, 141, 140, 146, 257/162, 549, 550, 553; 438/309
See application file for complete search history.

(56) References Cited

U.S. PATENT DOCUMENTS

| | | | |
|---|---|---|---|
| 5,650,658 A * | 7/1997 | Beasom | 257/409 |
| 6,483,149 B1 * | 11/2002 | Mosher et al. | 257/356 |
| 6,593,621 B2 * | 7/2003 | Tsuchiko et al. | 257/335 |
| 6,903,421 B1 * | 6/2005 | Huang et al. | 257/356 |
| 7,002,211 B2 * | 2/2006 | Onishi et al. | 257/342 |
| 7,687,853 B2 * | 3/2010 | Pendharkar et al. | 257/343 |
| 2005/0179087 A1 * | 8/2005 | Lin et al. | 257/356 |

* cited by examiner

*Primary Examiner* — Dao H Nguyen
*Assistant Examiner* — Tram H Nguyen
(74) *Attorney, Agent, or Firm* — The Law Offices of Andrew D. Fortney; Andrew D. Fortney

(57) ABSTRACT

An LDMOS device and method for making the same are disclosed. The LDMOS device comprises a first well, a second well, a third well, a first ion implantation region, and a second ion implantation region. The first well is in a semiconductor substrate. The second well is in the first well. The third well is first well adjacent to the second well. The first ion implantation region is in the second well. The second ion implantation region is in the third well. A device isolation layer structure between a P-type well region and a P-type body of the LDMOS device may be eliminated, thereby preventing a reduction in the doping concentration of the P-type well, thus minimizing leakage current and maintaining a high breakdown voltage.

18 Claims, 1 Drawing Sheet

FIG. 1
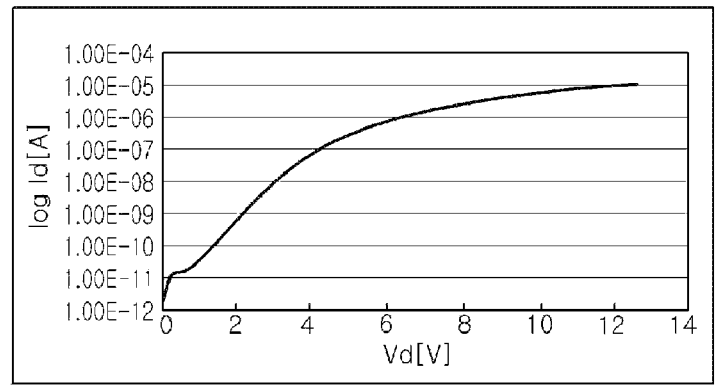
FIG. 2A
FIG. 2B
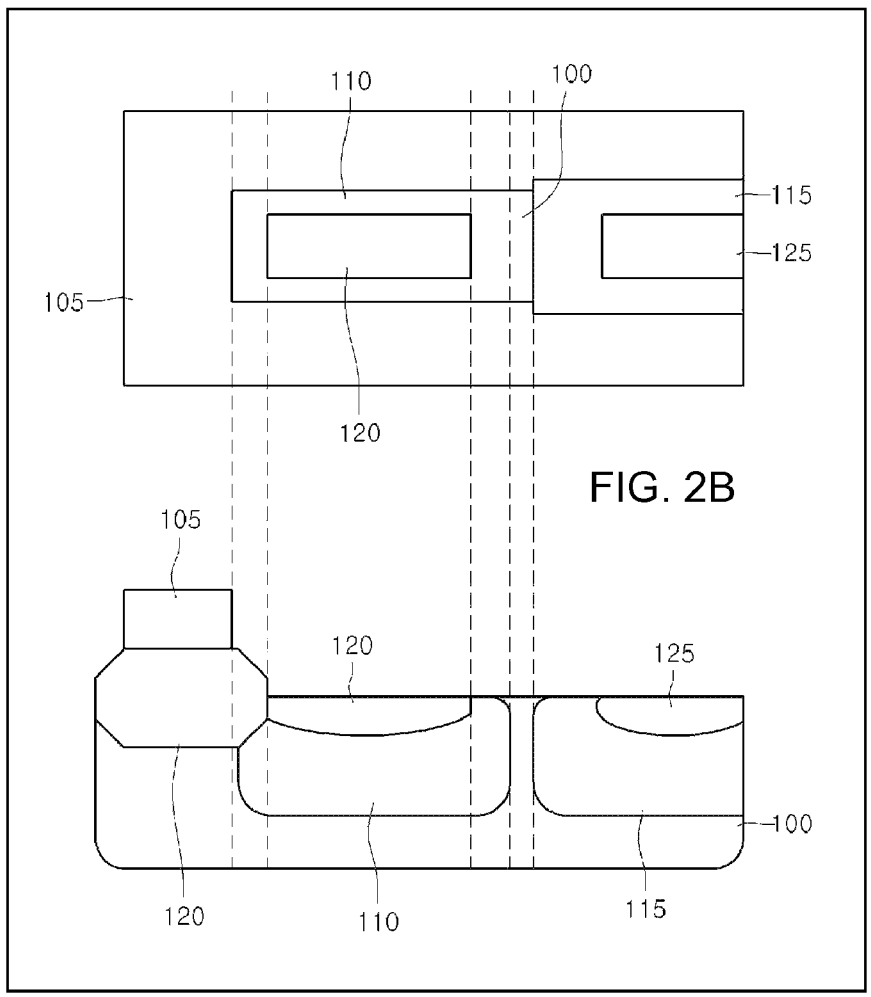

LATERAL DOUBLE DIFFUSED METAL OXIDE SEMICONDUCTOR DEVICE AND METHOD OF MAKING THE SAME

CROSS-REFERENCE TO RELATED APPLICATIONS

This application claims the benefit under 35 U.S.C. §119 of Korean Patent Application No. 10-2008-0125500, filed on Dec. 10, 2008, which is incorporated herein by reference in its entirety.

BACKGROUND

The present disclosure relates to laterally diffused metal oxide semiconductor (LDMOS) devices and methods of making the same.

A depletion type MOSFET (DMOSFET) based on planar diffusion technology is one of the semiconductor devices used in the fields of switching mode power supply devices, lamp stabilization circuits and motor drive circuits, and in particular, laterally diffused metal oxide semiconductor (LDMOS) transistors have been developed.

A lateral double diffused metal oxide semiconductor (LDMOS) device is a typical example of a horizontal power device that provides rapid switching response and high input impedance by means of a majority carrier device. FIG. 1 is a graph illustrating the breakdown voltage characteristics of an LDMOS device in the case where the doping concentration of a P-type well decreases due to the device isolation layer structure.

In order to operate as a high-voltage device, the LDMOS device must maintain a high breakdown voltage and a low on-resistance (Ron). However, a P-type body is designed to have a sufficiently high doping concentration to prevent punch-through breakdown when applying a reverse bias voltage against a high voltage. However, the doping concentration of a P-type well typically decreases during a high-temperature thermal treatment process in the process of forming a device isolation region that isolates the P-type body and the P-type well.

Thus, a leakage current is generated due to depletion of dopant in the P-type well during thermal treatment, and it is difficult to achieve a targeted breakdown voltage, as illustrated in the graph of FIG. 2.

What is therefore desired is a technology for providing an LDMOS device that has a high breakdown voltage and good I-V characteristics by maintaining a fixed dopant concentration in a P-type well.

SUMMARY

Embodiments of the present invention provide LDMOS devices with a structure that can minimize leakage current and increase a breakdown voltage by maintaining a fixed dopant concentration in a P-type well.

In one aspect, the present invention relates to an LDMOS device comprising a first well in a semiconductor substrate; a second well in the first well; a third well in the first well adjacent to the second well; a first ion implantation region in the second well configured to function as a source contact region; and a second ion implantation region in the third well configured to function as a drift region.

In a second aspect, the present invention relates to a method of making an LDMOS device, comprising implanting first conduction type impurities into a semiconductor substrate to form a first well, implanting second conduction type impurities into the first well to form a second well and a third well adjacent to each other, implanting second conduction type impurities in the second well to form a source contact region, implanting first conduction type impurities in the third well to form a drift region, forming a device isolation structure in the first well, and forming a gate electrode on the device isolation structure.

The details of one or more embodiments of the present invention are set forth in the accompanying drawings and the description below. Other features will be apparent from the description and drawings.

BRIEF DESCRIPTION OF THE DRAWINGS

FIG. 1 is a graph illustrating the breakdown voltage characteristics of an LDMOS device in the case where the doping concentration of a P-type well decreases due to a device isolation structure.

FIGS. 2A-B illustrate a top or plan view and a cross-sectional view, respectively, of an LDMOS device according to an embodiment of the present invention.

DETAILED DESCRIPTION OF THE EMBODIMENTS

LDMOS devices according to embodiments of the present invention will be described in detail with reference to the accompanying drawings.

In the following descriptions of the embodiments, a detailed description of well-known functions or configurations has been omitted in order not to unnecessarily obscure the subject matter of the invention.

In the description of the embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

FIGS. 2A-B illustrates an exemplary structure of an LDMOS device according to an embodiment of the invention. FIG. 2A is a top or plan view of the exemplary LDMOS device, and FIG. 2B is a cross-sectional view of the exemplary LDMOS device.

In FIGS. 2A and 2B, the corresponding regions of the plan view and the cross-sectional view are represented by dotted lines.

Referring to FIGS. 2A-B, an LDMOS device according to an exemplary embodiment includes a first well 100, a second well 110, a third well 115, a first ion implantation region 120, a second ion implantation region 125, a device isolation region 130, and a gate 105. The gate 105 may comprise a polysilicon layer and, optionally, a metal silicide layer thereon, formed by known techniques.

The first well 100 may be formed as a High Voltage well in a semiconductor substrate (not illustrated) by implanting a high concentration of first conduction type impurities. In one embodiment, the first conduction type impurities are N-type impurity ions, and the first well is an N-type well (High Voltage NWELL (HVNWELL)), although the invention is not so limited. Thus, the first conduction type impurities may be P-type ions. The first well 100 prevents punch-through between the second well 110 and the semiconductor substrate. For example, the semiconductor substrate may be masked by photolithography to form a photoresist pattern, leaving a region exposed for forming first well 110. After implanting the first conduction type impurities, the photoresist pattern may be removed by ashing (e.g., using an oxygen-based plasma) and/or chemical stripping.

The second well 110 may be formed by implanting second conduction type impurities into first well 100. In some embodiments, the second well 110 is a P-type body formed by implantation of P-type impurity ions into the first well 100.

The third well 115 may be formed by implanting second conduction type impurities into first well 100. In some embodiments, third well 115 is a P-type well formed by implantation of P-type impurity ions into the first well 100 adjacent to second well 110. The third well 115 may be spaced apart from the second well 110 by a predetermined distance. In certain embodiments, the second well 110 and the third well 115 may be formed simultaneously using a single mask. First well 100 may be masked by photolithography to form a photoresist pattern, leaving regions exposed for forming second well 110 and third well 115. After implanting second conduction type impurities, the photoresist pattern may be removed by ashing (e.g., using an oxygen-based plasma) and/or chemical stripping.

The second well 110 is highly doped with impurity ions and is separated from the third well 115, thereby preventing a punch-through breakdown when applying a reverse bias voltage against a high voltage and providing a resistance to a high voltage.

The first ion implantation region 120 is formed in the second well 110 by implanting second conduction type impurities. The first ion implantation region 120 may be formed by implantation of P-type impurity ions. The first ion implantation region 120 may function as a source contact region.

The second ion implantation region 125 is formed in the third well 115 by implanting first conduction type impurities. The second ion implantation region 125 may be formed by implantation of N-type impurity ions. The second ion implantation region 125 may function as a source drift region. For example, the second ion implantation region 125 may be formed by implantation of As ions.

The second well 110 and the second ion implantation region 125 may constitute an active region of the LDMOS device.

The device isolation region 130 is formed on one side of the second well 110 and the first ion implantation region 120 (e.g., the side closest to the gate 105 and/or away from third well 115 and second ion implantation region 125). Device isolation region 130 may be formed by, e.g., local oxidation of silicon (LOCOS), employing a silicon nitride mask. The gate 105 is formed on the device isolation region 130. In some embodiments, gate 105 is a polysilicon gate, and is formed by, e.g., chemical vapor deposition (CVD) of silicon (e.g., from a silicon source such as silane) and annealing, then photolithographic patterning and etching. In certain embodiments (not shown), a drain region is formed on a side of the gate 105 opposite to the second well 110. The device isolation region 130 can function as a channel-extension device isolation region that allows a high-voltage current to flow by increasing the distance between the drain region and the first ion implantation region 120 serving as a source contact region.

According to an exemplary embodiment, a channel region of the LDMOS device is formed along the surface of the third well 115 between the second well 110 and the second ion implantation region 125.

As illustrated in FIG. 2, in certain embodiments a gate 105 may formed on the substrate except a portion of the third well 115 and the second well 110. In other embodiments (not shown), gate 105 is formed to at least partially cover a surface of the substrate on the opposite side of the device isolation region 130 relative to second well 110.

According to the LDMOS device, there is no need to form a device isolation layer structure between the second well 110 and the third well 115, thus preventing a reduction in the doping concentration in the third well 115 during a thermal treatment process.

Also, the doping concentration of the third well 115 remains high, thus minimizing leakage current and maintaining a high breakdown voltage. Accordingly, the current flow path is distributed, thus improving the current and I-V characteristics of the LDMOS device.

Various embodiments of the present invention have the following effects.

Firstly, a device isolation layer structure between the P-type well region and the P-type body of the LDMOS device is removed, thereby preventing a reduction in the doping concentration of the P-type well.

Secondly, the doping concentration of the P-type well remains high, thus minimizing leakage current and maintaining a high breakdown voltage. Accordingly, the current flow path is distributed, thus improving the current and I-V characteristics of the LDMOS device.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is within the purview of one skilled in the art to effect such feature, structure, or characteristic in connection with other embodiments.

Although embodiments of the present invention have been described with reference to a number of illustrative embodiments thereof, it should be understood that numerous other modifications and embodiments can be devised by those skilled in the art that will fall within the spirit and scope of the principles of this disclosure. More particularly, variations and modifications are possible in the component parts, steps and/or arrangements within the scope of the disclosure, the drawings and the appended claims. In addition to variations and modifications in the component parts, steps and/or arrangements, alternative uses will also be apparent to those skilled in the art.

What is claimed is:

1. A laterally diffused metal oxide semiconductor (LDMOS) device comprising:
    a first well having a first conduction type in a semiconductor substrate;
    a second well having a second conduction type in the first well;
    a third well having the second conduction type in the first well adjacent to the second well;
    a first ion implantation region in the second well configured to function as a source contact region; and
    a second ion implantation region in the third well configured to function as a drift region, wherein the first and second ion implantation regions have opposite conduction types.

2. The LDMOS device according to claim 1, wherein the first well comprises an N-type well.

3. The LDMOS device according to claim 1, wherein the second well comprises a P-type body.

4. The LDMOS device according to claim 1, wherein the third well comprises a P-type well.

5. The LDMOS device according to claim 1, wherein the third well is spaced apart from the second well.

6. The LDMOS device according to claim 1, wherein the first ion implantation region comprises P-type impurity ions.

7. The LDMOS device according to claim 1, wherein the second ion implantation region comprises N-type impurity ions.

8. The LDMOS device according to claim 1, further comprising a device isolation region adjacent to the second well and the first ion implantation region.

9. The LDMOS device according to claim 8, further comprising a gate on the semiconductor substrate including the device isolation region.

10. A method of making a LDMOS device, comprising:
   implanting first conduction type impurities into a semiconductor substrate to form a first well;
   implanting second conduction type impurities into the first well, to form a second well and a third well adjacent to each other;
   implanting second conduction type impurities in the second well to form a source contact region, wherein the first and second conductive type impurities have opposite conduction types;
   implanting first conduction type impurities in the third well to form a drift region;
   forming a device isolation structure in the first well; and
   forming a gate electrode on the device isolation structure.

11. The method of claim 10, wherein said first conduction type impurities are N-type impurity ions, and said second conduction type impurities are P-type impurity ions.

12. The method claim 10, wherein the first well comprises an N-type well.

13. The method claim 10, wherein the second well comprises a P-type body.

14. The method claim 10, wherein the third well comprises a P-type well.

15. The method claim 10, wherein the third well is spaced apart from the second well.

16. The method claim 10, wherein the source contact region comprises P-type impurity ions.

17. The method claim 10, wherein the drift region comprises N-type impurity ions.

18. The method claim 10, wherein the device isolation structure is under the gate, and separates the gate from the second well and the source contact region.

\* \* \* \* \*